(12) United States Patent
Ausserlechner

(10) Patent No.: US 11,112,467 B2
(45) Date of Patent: *Sep. 7, 2021

(54) MAGNETIC FIELD SENSOR CIRCUIT IN PACKAGE WITH MEANS TO ADD A SIGNAL FROM A COIL

(71) Applicant: Infineon Technologies AG, Neubiberg (DE)

(72) Inventor: Udo Ausserlechner, Villach (AT)

(73) Assignee: Infineon Technologies AG

( * ) Notice: Subject to any disclaimer, the term of this patent is extended or adjusted under 35 U.S.C. 154(b) by 0 days.

This patent is subject to a terminal disclaimer.

(21) Appl. No.: 16/865,992

(22) Filed: May 4, 2020

(65) Prior Publication Data

US 2020/0264246 A1 Aug. 20, 2020

Related U.S. Application Data

(63) Continuation of application No. 15/832,074, filed on Dec. 5, 2017, now Pat. No. 10,670,671, which is a continuation of application No. 15/251,811, filed on Aug. 30, 2016, now Pat. No. 9,869,729.

(51) Int. Cl.
*G01R 33/07* (2006.01)
*G01R 33/00* (2006.01)

(52) U.S. Cl.
CPC ......... *G01R 33/07* (2013.01); *G01R 33/0094* (2013.01)

(58) Field of Classification Search
CPC .................................................. G01R 33/0094
See application file for complete search history.

(56) References Cited

U.S. PATENT DOCUMENTS

| | | | | |
|---|---|---|---|---|
| 6,696,834 B2* | 2/2004 | Kou | .................... | G01R 29/0878 324/225 |
| 2009/0001964 A1* | 1/2009 | Strzalkowski | ....... | G01R 15/202 324/202 |
| 2009/0167301 A1* | 7/2009 | Ausserlechner | ... | G01R 33/0035 324/252 |
| 2016/0154027 A1* | 6/2016 | Claeys | .................. | H01F 27/266 324/127 |

* cited by examiner

*Primary Examiner* — Alvaro E Fortich
(74) *Attorney, Agent, or Firm* — Design IP

(57) ABSTRACT

Sensor devices, systems and methods are provided, including a first magnetic sensor configured to measure a first magnetic field in a first frequency range and output a first sensor signal based on the measured first magnetic field, a second magnetic sensor configured to measure a second magnetic field in a second frequency range and output a second sensor signal based on the measured second magnetic field, and a sensor circuit configured to receive the first and the second sensor signals, combine the first and the second sensor signals, and output a combined sensor signal. The first magnetic sensor and the second magnetic sensor are configured to share a cross-over frequency.

19 Claims, 3 Drawing Sheets

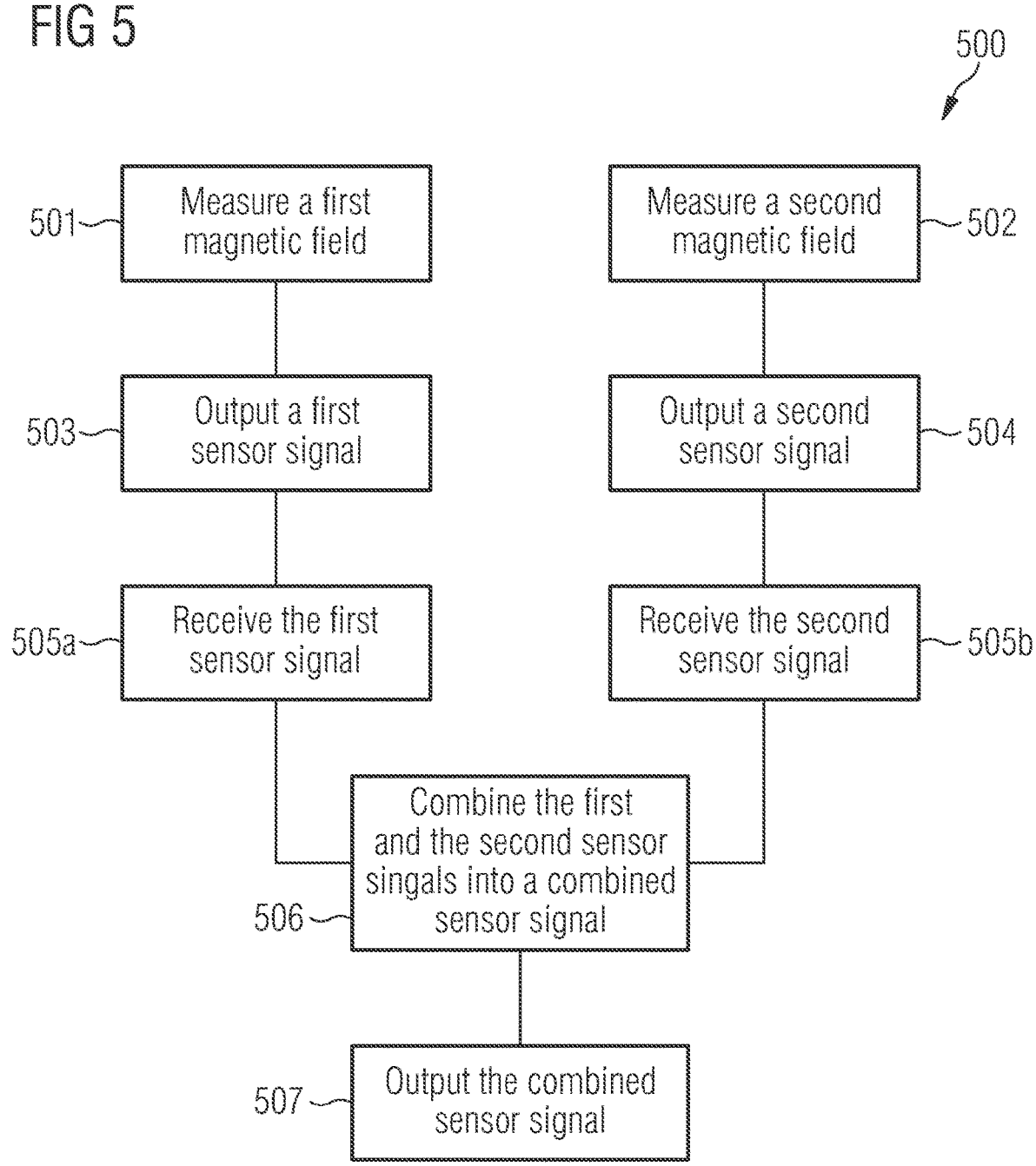

MAGNETIC FIELD SENSOR CIRCUIT IN PACKAGE WITH MEANS TO ADD A SIGNAL FROM A COIL

CROSS REFERENCE TO RELATED APPLICATIONS

This application is a continuation of U.S. patent application Ser. No. 15/832,074 filed on Dec. 5, 2017, which is a continuation of U.S. patent application Ser. No. 15/251,811 filed on Aug. 30, 2016, the contents of which are hereby incorporated by reference herein.

FIELD

The present disclosure relates generally to devices and to methods for sensing a magnetic field, and, more particularly, to magnetic field sensors.

BACKGROUND

Sensors generally measure a physical quantity and convert the measured physical quantity into a signal that is provided to an electronic instrument (e.g., integrated chip processor). For instance, magnetic sensors measure a magnetic field using one or more magnetic field sensor elements sensitive to magnetic fields, and output an electric signal (e.g., voltage signal or current signal) corresponding to the measured magnetic field.

A sensor package may also include a signal processing circuit that receives the signal (i.e., sensor signal) from the magnetic field sensor element and derives, from the sensor signal, a measurement signal. Therefore, a sensor package can include a magnetic field sensor and a circuit which conditions and amplifies the small signal of the magnetic field sensor via signal conditioning.

Magnetic field sensor elements typically have either limited magnetic sensitivity or limited bandwidth. For example, a Hall plate has moderate magnetic sensitivity of 50 mV/V/T and its bandwidth is limited to 30 kHz due to eddy currents in the leadframe of a leaded package, or it is limited to a bandwidth of 150 kHz due to the signal conditioning circuit in the package. For example, the signal conditioning circuit may be a spinning Hall probe circuit, which is a time discrete circuit operating at a chopper frequency of 50-500 kHz.

In addition, the above magnetic field sensor elements are resistive devices having typical resistance of a few kilo-ohms, which creates a large amount of noise at high frequencies (e.g., in the MHz range). This further restricts the frequency at which these sensor elements can be operated.

An on-chip coil disposed on a surface of a semiconductor chip may also be used as a magnetic field sensor element. The on-chip coil may have large bandwidth if it is not mounted near a conducting plate, such as the leadframe. However, the on-chip coil has only limited magnetic sensitivity because its effective area is small due to the small size of the semiconductor die (e.g., in the order of a few square millimeters) and the number of turns is also limited to 10-1000 because there are only a few metallization layers available in commercial micro-electronic processes.

In view of the above, current magnetic field sensors have a limited signal-to-noise ratio (SNR) at large bandwidths.

SUMMARY

Embodiments provide a device or a system in which a first magnetic sensor is configured to measure a first magnetic field in a first frequency range and output a first sensor signal based on the measured first magnetic field, a second magnetic sensor is configured to measure a second magnetic field in a second frequency range and output a second sensor signal based on the measured second magnetic field, the first magnetic sensor and the second magnetic sensor share a cross-over frequency, and a sensor circuit is electrically coupled to the first magnetic sensor and to the second magnetic sensor, the sensor circuit is configured to receive the first sensor signal and the second sensor signal, combine the first sensor signal and the second sensor signal, and output a combined sensor signal derived from combining the first sensor signal and the second sensor signal.

Embodiments further provide a method of measuring magnetic fields using a first magnetic sensor and a second magnetic sensor. The method includes measuring, by the first magnetic sensor, a first magnetic field in a first frequency range, outputting, by the first magnetic sensor, a first sensor signal based on the measured first magnetic field, measuring, by the second magnetic sensor, a second magnetic field in a second frequency range, where the first magnetic sensor and the second magnetic sensor share a cross-over frequency, outputting, by the second magnetic sensor, a second sensor signal based on the measured second magnetic field, receiving, by a sensor circuit, the first sensor signal and the second sensor signal, combining, by the sensor circuit, the first sensor signal and the second sensor signal, and outputting, by the sensor circuit, a combined sensor signal derived from combining the first sensor signal and the second sensor signal.

BRIEF DESCRIPTION OF THE DRAWINGS

Embodiments are described herein making reference to the appended drawings.

FIG. 5 shows a flow diagram of a method of measuring magnetic fields according to one or more further embodiments.

DETAILED DESCRIPTION

Figure 1:
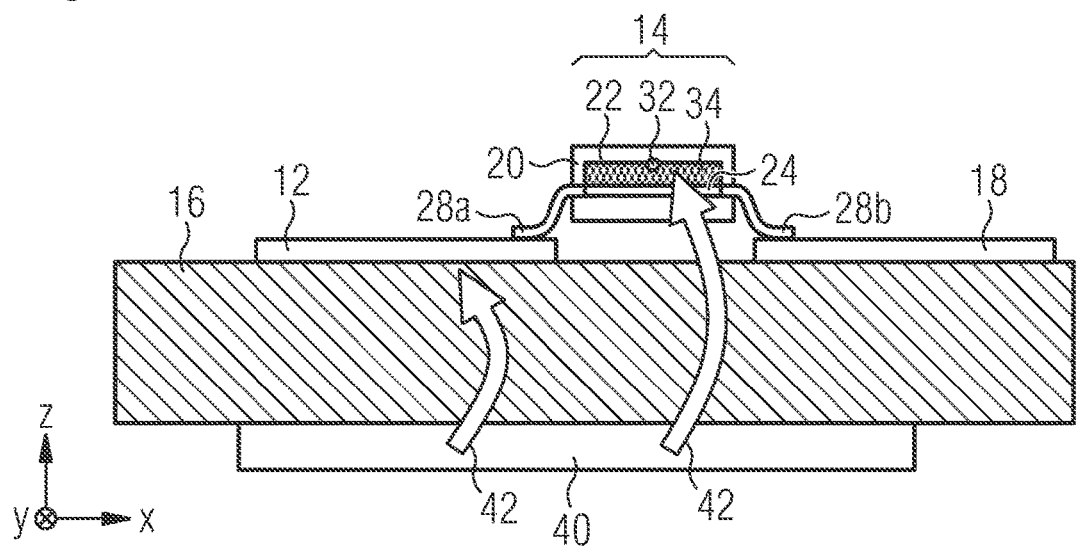
FIG. 1 shows a cross-section view of a magnetic field sensor system according to one or more embodiments.

In the following, a plurality of details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Embodiments relate to sensors and sensor systems, and to obtaining information about sensors and sensor systems. A sensor, as already mentioned in the background section, may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a current sensor, gauss meter, an angle sensor, a linear position sensor, speed sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.) corresponding to detecting and/or measuring the magnetic field pattern of an element that generates the magnetic field (e.g., a magnet, a current-carrying conductor (e.g. a wire), the Earth, or other magnetic field source).

According to one or more embodiments, a magnetic field sensor and a sensor circuit are both accommodated in the same chip package (e.g., a plastic encapsulated package, such as leaded package or leadless package, or a surface mounted device (SMD)-package). This chip package is also referred to as sensor package. One or more magnetic field sensor elements, or for short a magnetic field sensor, included in the sensor package is thus exposed to the magnetic field, and the sensor signal (e.g., a voltage signal) provided by the magnetic field sensor element is proportional to the magnitude of the magnetic field, for example.

The sensor circuit may be referred to as a signal processing circuit and/or a signal conditioning circuit that receives the signal (i.e., sensor signal) from the magnetic field sensor element and derives, from the sensor signal, a measurement signal that represents the magnetic field. Therefore, the sensor package comprises a circuit which conditions and amplifies the small signal of the magnetic field sensor via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

Magnetic field sensor elements include Hall plates, vertical Hall effect devices, magneto-resistive sensors, often referred to as XMR sensors which is a collective term for anisotropic magneto-resistive (AMR), giant magneto-resistive (GMR), tunneling magneto-resistive (TMR), and colossal magneto-resistive (CMR) sensors, or magnetic field sensitive metal-oxide-semiconductor field-effect transistors (MOSFETs) (MAGFETs). It is also possible to use on-chip coils made from an interconnect layer of the semiconductor process (e.g., the wiring layers) and laid out on the surface of the semiconductor chip(s). It is also possible to use giant magneto-impedance (GMI) devices, which are not built into/onto the surface or in the bulk of a die, but which are wires mounted onto some holding structure so that the magnetic field sensitive device does not necessarily need to be linked to some die or platelet.

According to one or more embodiments, input terminals are provided on the sensor package, to which an off-chip sensor element is be connected. Thus, an on-chip magnetic sensor and an off-chip magnetic sensor are provided that provide a combined wide frequency bandwidth. For example, the sensors may be configured to senses a magnetic field over a frequency bandwidth from 0 Hz (i.e., direct current (DC)) to the MHz range (e.g., to one or more MHz).

The on-chip magnetic sensor may include any of the aforementioned magnetic field sensor elements, and may be referred to as a Hall sensor, an XMR sensor (e.g., AMR sensor, GMR sensor, TMR sensor, CMR sensor), a MAGFET, a coil sensor, a GMI sensor, or the like.

In one or more embodiments, the on-chip magnetic sensor may include one or more spinning current Hall plates operated in a spinning current mode. A spinning current Hall plate may be configured with four terminals, in which current is sent to a first pair of terminals (e.g., supply terminals), while a second pair of terminals are used to test an output voltage (e.g., sense terminals). Ideally, a Hall plate is perfectly symmetric such that there is a zero output voltage in the presence of a zero applied magnetic field. However, in practice, there is likely some asymmetry present, which induces an undesirable offset in the measurement. Thus, to compensate for the asymmetry, a spinning current mode may be used.

In spinning current mode, the spinning current Hall plate is operated in a spinning current mode in which two operating phases are used such that the supply terminals and sense terminals are repeatedly alternated between the pairs of terminals. The signals of the two operating phases are added by a sensor circuit such that the offset errors caused by the asymmetry cancel out.

However, since spinning current mode is not a time-continuous procedure (i.e., it is a time-discrete procedure comprising several operating phases), it typically cannot be used at high frequencies, as a higher offset error results and becomes more difficult to compensate. Thus, an on-chip magnetic sensor using spinning current Hall plates, according to one or more embodiments, may be configured to operate at frequencies of about 150 kHz or less, and may be further configured to operate at about 100 kHz or less, about 10 kHz or less, or about 1 kHz or less. The frequency at which a sensor can operate is directly proportional to the frequency of the magnetic field the sensor can detect.

The off-chip magnetic sensor may be one or more inductance coils or may be comprised of one or more inductance coils, and may also be referred to as a coil system. A coil, according to this example, may be metal wound comprising thin or thick wire with small or large number of turns and small or large size. This coil may be implemented with conductive traces in a component board (e.g., a printed circuit board (PCB)) to which the sensor package can be mounted and electrically connected. This coil may also include additional means, such as flux concentrators, which focus magnetic flux through the coil. These flux concentrators may comprise soft magnetic material, such as soft ferrites, that is particularly apt for high operating frequencies in the MHz range. This coil may be round, rectangular, flat or on curved surfaces, cylindrical, single-layered or multi-layered.

The coil may be a simple one or a differential one. The simple coil may be a non-differential coil with one terminal connected to signal ground and another terminal that outputs a sensor signal to the sensor package.

A differential coil may be a coil that is split in two parts, or windings, with equal product of area times a number of turns but with a different sign of induced voltage when exposed to time-varying spatially homogeneous magnetic fields. For example, a coil consist of N turns, spreading over an area A, so that the product of area times number of turns is N*A. In a differential coil, two coils are present having a product of area times number of turns N1*A1 and N2*A2, respectively, that are equal (i.e., N1*A1=N2*A2). However, for each coil of a differential coil only the product needs to be equal, but they need not have equal number of turns or equal area. Thus, N1 and N2 may differ and A1 and A2 may also differ. Thus, the differential coil has two output terminals, one for each coil, winding (or sub-winding).

The purpose of differential coils is to cancel out homogenous magnetic disturbances while still responding to magnetic field gradients of the field to be detected. For example, the differential coil may detect a voltage (i.e., sensor signal of the off-chip magnetic sensor) across two terminals of the differential coil. The voltage is equal to d(N1*A1*B1)/dt− d(N2*A2*B2)/dt. where B1 and B2 are the external magnetic fields sensed at coil 1 and coil 2, respectively, N1*A1*B1 is the total magnetic flux through coil 1, N1*A2*B2 is the total flux through coil 2, and the voltage is the difference of both time derivatives.

In a simple case, there is just one signal input terminal, for example, one dedicated lead, of the sensor package connected to the off-chip coil (e.g., in the case of a simple coil). The signal input terminal of the sensor package is connected to the semiconductor die within the sensor package.

In another example, the off-chip coil may have two output terminals (e.g., in the case of a differential coil). For an off-chip coil that has two output terminals, each output terminal is connected to the sensor package. Thus, the sensor package may be provided with two or more dedicated signal input terminals to which the coil can be connected for receiving sensor signals. For example, for more complex coil systems a larger number of signal input terminals (e.g., two or more) on the sensor package can be provided.

Signal ground may be provided external to the sensor package, or, additionally or alternatively, may be achieved by a connection to a terminal (e.g., a dedicated lead) of the sensor package that is connected to signal ground.

The signal input terminals of the sensor package may be routed through to an electronic circuit (e.g., a sensor circuit) within the sensor package which processes the signal(s) of the coil(s) (e.g., by amplification and low-pass/high-pass/band-pass/band-stop-filtering or integrating). Finally, this sensor circuit combines the signal(s) of the coil with the signal(s) of the on-chip magnetic field sensor element(s).

According to the above, a magnetic field sensor system is provided that includes two sensor elements: an on-chip magnetic sensor and an off-chip magnetic sensor. The on-chip magnetic field sensor (i.e., on-chip low frequency sensor) detects static and low-frequency magnetic fields, while the off-chip magnetic sensor (i.e., off-chip high frequency sensor) detects high frequency magnetic fields. The signals from the on-chip and off-chip sensor elements are combined to give a response that is flat from zero (e.g., direct current (DC)) to several MHz. The off-chip magnetic sensor may be an off-chip coil, as described herein.

In addition, an increase in design flexibility may be achieved by providing the coil "off-chip" since the coil is not bound by the same design concerns as on-chip coils. For example, when splitting off the off-chip coil from the on-chip sensor, the off-chip coils may be configured to achieve large sensitivities (e.g., by many turns of the winding) so that the cross-over frequency between on-chip and off-chip sensor elements in the signal conditioning and combining circuit can be chosen at very low frequencies. Thus, frequencies detected by the on-chip sensor that are above the cross-over frequency are attenuated in the signal path of the on-chip sensor, and frequencies detected by the off-chip sensor that are below the cross-over frequency are attenuated in the signal path of the off-chip sensor.

For example, if a coil is "on-chip", it is difficult to use the coil for frequencies less than 20 kHz due to the size limitations of the chip (i.e., a larger coil with a larger number of turns is needed). Therefore, an on-chip Hall-plate sensor, for example, would need to cover a range from 0 Hz to 20 kHz, which is difficult to achieve. However, if one uses an off-chip coil according to the embodiments disclosed herein, the coil may consist of many turns with larger area and may be used down to frequencies of about 1 kHz. Thus, an on-chip Hall-plate sensor needs only to cover 0 Hz to about 1 kHz, which is much more feasible. In this lower frequency range (i.e., lower bandwidth), the sensor circuit (e.g., the Hall-plate sensor conditioning circuit, such as a spinning circuit) can be optimized to give less residual offset and less noise than compared to a larger bandwidth of 0 Hz to 20 kHz.

In the case that the on-chip magnetic sensor is a spinning current Hall device with one or more spinning current Hall plates, the cross-over frequency may be about 150 kHz or less, and more preferably about 100 kHz or less, and a more preferably about 10 kHz or less, and more preferably about 1 kHz or less, and where the off-chip sensor may operate at a frequency from the cross-over frequency up to 1 MHz or more.

Furthermore, higher frequencies can create a problem for a sensor circuit as a result of the leadframe of a typical plastic encapsulated package. In particular, the high-frequency components of the magnetic field to be measured may cause large eddy currents in the leadframe thereby distorting the frequency response of the sensor circuit. However, according to the embodiments disclosed herein, by using only a low-frequency (e.g., a Hall plate sensor) in the sensor package, where eddy currents are an issue, this problem can be avoided. Instead, the high frequency portion of the signal is delivered by the off-chip coil, which has no limitation by the leadframe of the sensor package.

The magnetic field sensor system, as provided herein, may be used as a current sensor, but is not limited thereto. For example, the magnetic field sensor system can be used as a current sensor if it is coupled to the magnetic field generated by some current to be measured which flows through some primary conductor. For example, contactless current measurement can be accomplished by using the magnetic field sensor system to sense the magnetic field caused by a current passing through the primary conductor (further referred to as primary current). The magnetic field caused by the primary current depends on the magnitude of the primary current. For example, for a long straight wire carrying a primary current $i_P$ the magnitude of the resulting magnetic field H at a distance d from the wire is directly proportional to the primary current $i_P$. In accordance to the Biot-Savart law, the magnitude of the magnetic field H equals $H=i_P/(2\pi d)$ if the wire is very long (theoretically infinitely long) as compared to the distance d.

According to one or more embodiments, a sensor package, which includes the magnetic field sensor element (e.g., a Hall sensor) is placed closely to the primary conductor. The magnetic field sensor element (or magnetic field sensor) included in the sensor package is thus exposed to the magnetic field caused by the primary current, and the sensor signal (usually a voltage signal) provided by the magnetic field sensor element is proportional to the magnitude of the magnetic field and thus also proportional to the primary current. Thus, the on-chip magnetic sensor is provided to cover a lower frequency range of the magnetic field generated by the primary current.

Similarly, the off-chip coil is placed in proximity to the primary conductor to measure a higher frequency range of the magnetic field generated by the primary current.

FIG. 1 shows a cross-section view of a magnetic field sensor system 10 according to one or more embodiments. The magnetic field sensor system 10 includes an off-chip magnetic sensor 12 (e.g., off-chip coil 12) and a sensor package 14 each disposed on top of a PCB 16. It will be appreciated that the PCB 16, is not limited thereto, and may be any component board (e.g., an insulated metal plane), and may be comprised of a single or multiple layers. This structure may be collectively referred to as a substrate.

The off-chip coil 12 may be a dedicated device on a plastic coil former (not shown) or it may be implemented as PCB-trace such that it is integrated into the PCB. For example, in a multi-layer PCB, the off-chip coil 12 may be formed in a top layer, bottom layer, or an intermediary layer of the PCB 16.

The sensor package 14 may include a non-magnetic package, or case, made of mold resin with a copper leadframe. Furthermore, the leads of the sensor package 14 and the off-chip coil 12 may be integrated in the component board, and may further be placed below the sensor package 14.

The magnetic field sensor system 10 further includes traces 18. For example, one or more traces 18 may be an interconnect for connecting one or more terminals of the off-chip coil 12 to one or more terminals or leads of the sensor package 14. Further, one or more traces 18 may be connected to one or more terminals of the sensor package 14 to provide a connection to sensor supply and sensor ground, and to provide a connection to output signals (e.g., measurement signals) from the sensor package 14.

The sensor package 14 includes a case 20, a semiconductor die 22, disposed on a die paddle 24, and a leadframe comprised of terminals 28 (e.g., leads) for receiving or transmitting signals and/or supplying power. For example, terminal 28a is connected to the off-chip coil 12 and is configured to receive a coil input (e.g., measurement signal). Terminal 28b is connected to a trace 18 and to one or more components of the sensor package 14.

The die paddle 24 is a thin plane of metal, within a packaged integrated circuit, to which a die 22 is attached and which in turn is a part of the leadframe (i.e., terminals 28).

The semiconductor die 22 includes an on-chip magnetic sensor 32 and a sensor circuit 34, each disposed on a semiconductor die 22 and integrated thereto.

The on-chip magnetic sensor 32 may be disposed at or in proximity to an upper surface of the semiconductor die 22. The on-chip magnetic sensor 32 may be a spinning current Hall device, or other magnetic sensor capable of detecting static and low-frequency magnetic fields.

The sensor circuit 34 may be a signal conditioning and combining circuit, as described above, and may further include a spinning Hall probe circuit. In particular, the sensor circuit 34 receives raw measurement signals (e.g., analog signals) from the off-chip coil 12 and the on-chip magnetic sensor 32, processes the raw measurement signals and combines the processed signal(s) of the off-chip coil 12 with the processed signal(s) of the on-chip magnetic sensor 32. The combined signal may then be output from the sensor package 14 by one of the terminals 28 to one of the traces 18 that provides the combined signal to an external device (e.g., to an external processor). Further, it will be appreciated that, as the sensor circuit 34 is integrated on the semiconductor die 22, specific circuit structures are not shown.

Since usually the off-chip coil 12, as a passive component, is not supplied with electric power, its DC potential is undefined. As a result, the sensor circuit 34 may be configured to define the common mode potential of at least one terminal of the at least two input terminals for the coil 12.

The magnetic field sensor system 10 may be configured such that a primary conductor 40 is provided on or in proximity to an opposing side of the PCB 16 relative to the side on which the off-chip coil 12 and sensor package 14 are provided. A primary current passing through the primary conductor 40 generates a magnetic field 42 that is sensed by the off-chip coil 12 and the on-chip magnetic sensor 32. The off-chip coil 12 is provided to cover a higher frequency range of the magnetic field generated by the primary current, while the on-chip magnetic sensor 32 is provided to cover a lower frequency range of the magnetic field generated by the primary current.

Further, while certain embodiments describe utilizing the magnetic field sensor system 10 as a current sensor, it will be appreciated that the magnetic field sensor system 10 is not limited thereto, and that it may be used to detect any magnetic field, generated in various ways, in which it is desired to measure lower and higher frequency components or ranges thereof. For example, the field sensor system 10 may be used as a speed sensor to a magnetic field produced by a permanent magnet that rotates on a tooth wheel of a gear or cog.

As shown in FIG. 1, the PCB 16 defines the spacing between the sensing elements and the primary conductor 40 such that a desired magnetic sensitivity can be configured for the sensing elements. Further, the PCB serves as a galvanic isolation with large creepage distance between the primary conductor 40 and the sensor circuit 34.

As will be further described below, the off-chip coil 12 and the on-chip magnetic sensor 32 may be configured as differential sensors in which there are an equal number of sub-components of each sensor symmetrically arranged about a center (longitudinal) axis of the primary conductor 40. A longitudinal axis, for example, is an axis that extends lengthwise through its object. While certain embodiments are described herein as having symmetrically arranged components, it will be appreciated that the components may be asymmetrically arranged.

Figure 2:
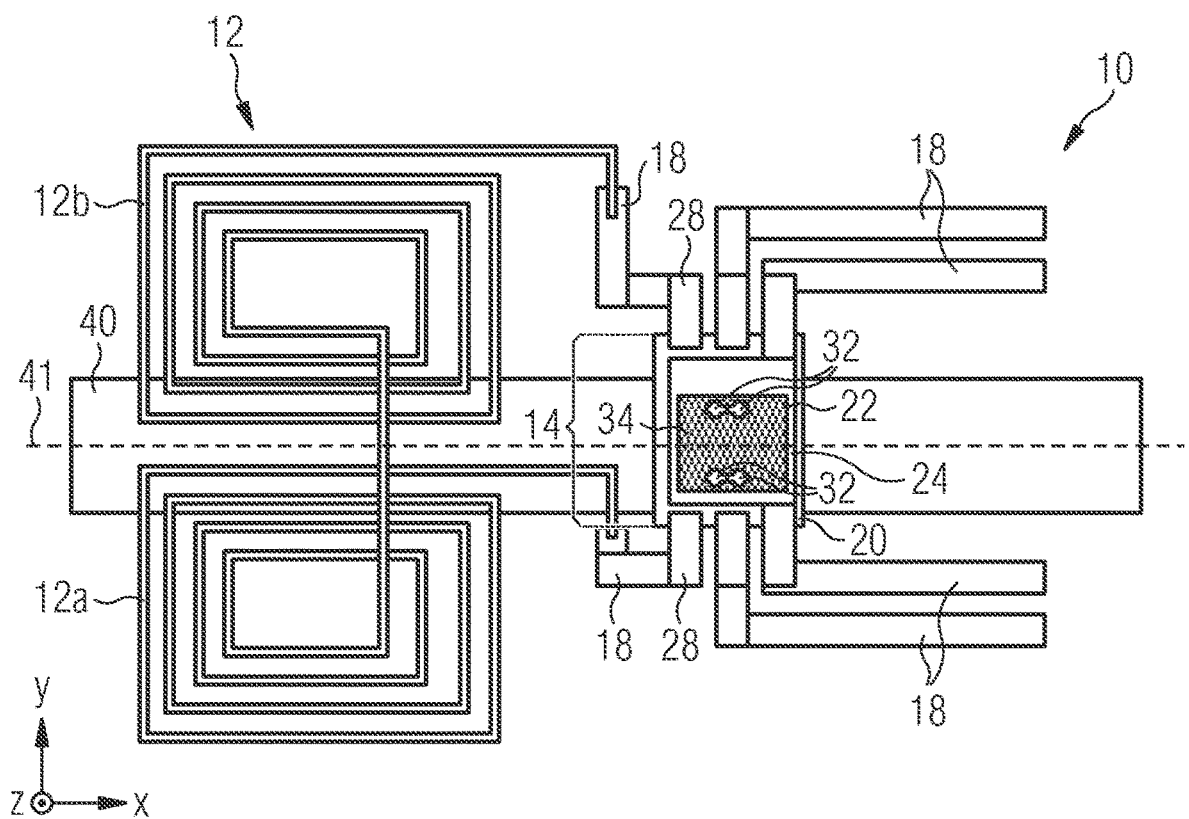
FIG. 2 shows a plan view of the magnetic field sensor system according to FIG. 1.

FIG. 2 shows a plan view of the magnetic field sensor system 10 according to FIG. 1, with the exception that the PCB 16 has been removed for illustration purposes only. In particular, FIG. 2 shows that the off-chip coil 12 and the on-chip magnetic sensor 32 are configured as differential sensors in which there are an equal number of sub-components of each sensor arranged to detect a magnetic field produced by the primary conductor 40.

For example, as shown in FIG. 2, the off-chip coil 12 is a differential coil that includes a first coil 12a and a second coil 12b that may be symmetrically arranged about a center (longitudinal) axis 41 of the primary conductor 40 such that right-to-center and left-to-center symmetry is achieved. That is, a portion of coil 12a and a corresponding counterpart portion of coil 12 may be about (in consideration of standard manufacturing tolerances of 5%) a same distance laterally (e.g., in the y-direction) and vertically (e.g., in the z-direction) from a center axis 41 of the primary conductor 40. The first coil 12a and the second coil 12b are connected to each other in a subtracting manner to cancel out homogeneous background fields. These coils 12a and 12b may be dedicated devices on plastic coil formers (not shown) or they may be implemented as PCB-traces such that they are integrated into the PCB 16.

The differential coil may detect a voltage (i.e., the sensor signal of the off-chip magnetic sensor) across two terminals 18 of the differential coil. The voltage is equal to $d(N1*A1*B1)/dt - d(N2*A2*B2)/dt$, where B1 and B2 are the external magnetic fields sensed at coil 12a and coil 12b, respectively, $N1*A1*B1$ is the total magnetic flux through coil 12a, $N1*A2*B2$ is the total magnetic flux through coil 12b, and the voltage is the difference of both time derivatives.

It will be further appreciated that the first coil 12a and a second coil 12b may be asymmetrically arranged about the primary conductor.

The turn/area product $N1*A1$ of the first coil 12a is substantially equal (in consideration of standard manufacturing tolerances of 5% or less) to the turn/area product $N2*A2$ of the second coil 12b.

Similarly, the on-chip magnetic sensor 32 may include two or more sets of magnetic sensor elements 32a and 32b symmetrically (or asymmetrically) arranged about a center (longitudinal) axis 41 of the primary conductor 40 (in consideration of standard manufacturing tolerances of 5%). As shown in FIG. 2, the sets of magnetic sensor elements 32a and 32b each include two Hall plates for measuring the magnetic field 42. Thus, four magnetic sensor elements are present in this example. However, it will be appreciated that only one set of magnetic sensor elements may be used, and as set may include one or more magnetic sensor elements. Furthermore, it will be appreciated that the magnetic sensor elements are not limited to Hall plates and may be any type of magnetic sensor element (e.g., those magnetic sensor elements described above).

The magnetic sensor elements of sets 32a and 32b are connected to the sensor circuit 34 in a subtracting way to cancel out homogeneous background magnetic disturbances.

It will be further appreciated that, while symmetry of the of the off-chip coils and on-chip magnetic sensor elements may help to cancel out homogeneous background magnetic disturbance and/or maximize the sensitivity to the primary current in one or more embodiments, the off-chip coils and on-chip magnetic sensor elements may not be symmetrical about the center axis in other implementations.

The terminals of coils 12a and 12b may be connected to one of the traces 18 that interconnect to one of the terminals 28, respectively, for providing a coil input. The other of the six terminals 28 of the sensor package 14 may be connected to traces 18 for a sensor supply, a sensor ground and one or more output signals.

The PCB 16 may further serve as a galvanic isolation with large creepage distance (e.g. in x- and y-directions) between the primary conductor 40 and the sensor circuit 34.

As noted above, since usually the off-chip coil 12, as a passive component, is not supplied with electric power, its DC potential is undefined. As a result, the sensor circuit 34 may be configured to define the common mode potential of at least one terminal of the at least two input terminals for the coil.

Figure 3:
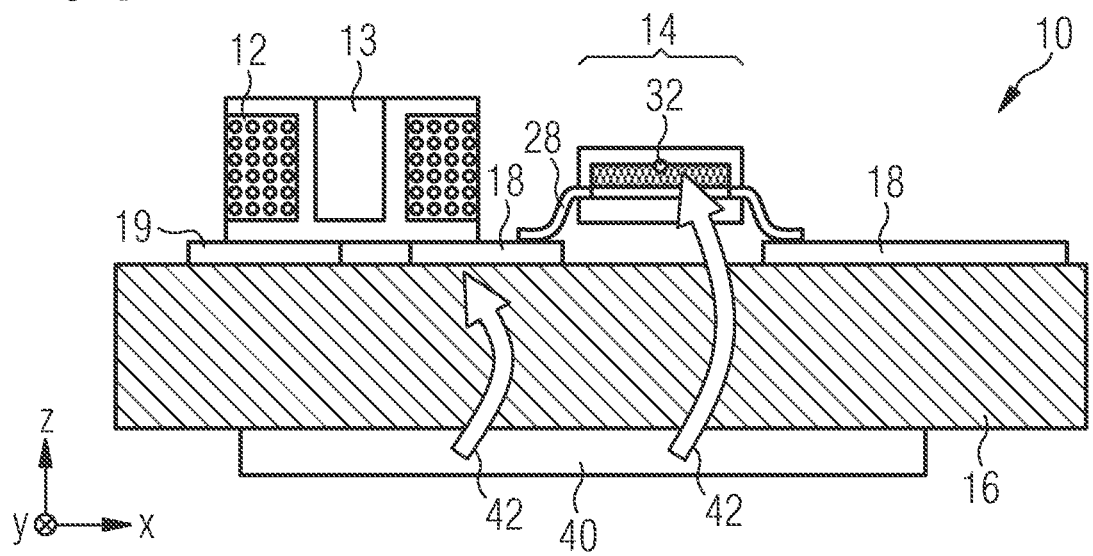
FIG. 3 shows a cross-section view of a magnetic field sensor system according to one or more further embodiments.

FIG. 3 shows a cross-section view of a magnetic field sensor system 10 according to one or more further embodiments. In particular, magnetic field sensor system 10 includes an off-chip coil 12 on a dedicated coil former 13 with a ferrite core. Furthermore, the off-chip coil 12 is connected to the sensor package 14 via a trace 18. The coil former 13 may be placed on substrate 19, which may be another PCB trace, pad or separate substrate (e.g., made of plastic) to keep the off-chip coil 12 planar relative to the primary conductor 40. It will be appreciated, as described above, that the traces 18 and 19 may be integrated into the PCB 16 such that the dedicated coil former 13 is placed directly on the PCB 16.

It will be appreciated that other elements of the magnetic field sensor system 10 shown in FIG. 3 are similar to those previously described. Thus, the description thereof is omitted for conciseness.

Figure 4:
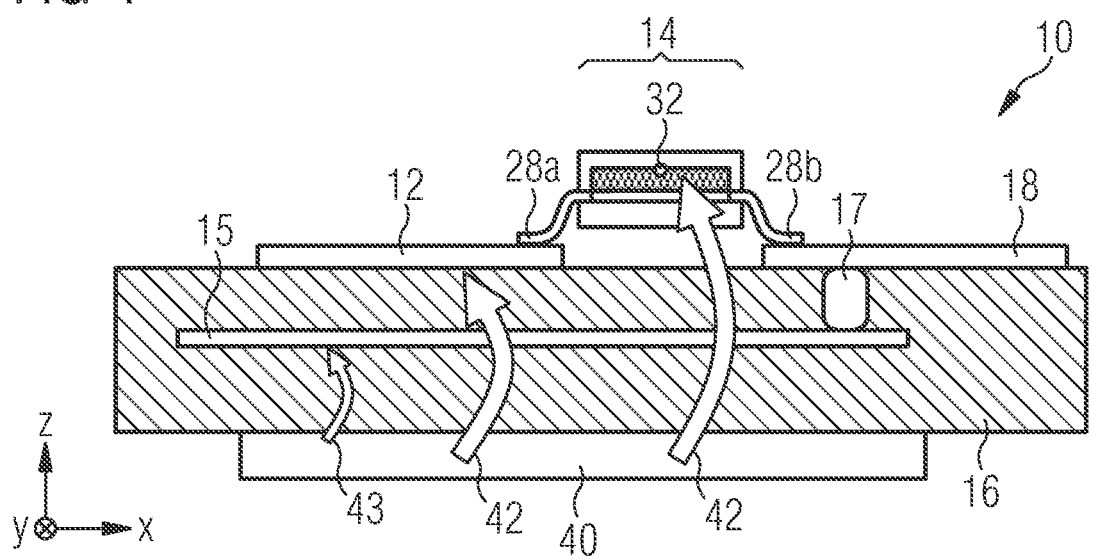
FIG. 4 shows a cross-section view of a magnetic field sensor system according to one or more further embodiments.

FIG. 4 shows a cross-section view of a magnetic field sensor system 10 according to one or more further embodiments. In addition to the magnetic field 42, the primary conductor 40 may produce an electric field 43. For example, the primary conductor 40 may be at high potential and it may be subject to steep voltage jumps, which may couple via the off-chip coil 12 to the sensor circuit 34 within the sensor package 14.

Accordingly, an electric shield 15 may be provided in the PCB 16 to shield the off-chip magnetic sensor 12 from the electric field 43. The electric shield 15 may be implemented with a multi-layer PCB 16 such that it is formed in an intermediate layer (e.g., between upper and lower surface of PCB 16). The electric shield 15 is also connected to ground via a via 17. For example, the via 17 may extend into the PCB 16 from a surface of the PCB 16 to the electric shield 15. At the surface of the PCB 16, the via 17 may be connected to a trace 18 that is connected to sensor ground. Alternatively, the connection to sensor ground may also be achieved by a wire connection (not shown) or the like.

The electric shield 15 should not be massive, because then the magnetic induction from the high-frequency components of the primary current in the primary conductor 40 may induce eddy currents in the shield 15 and this would distort the magnetic field 42 sensed by the off-chip magnetic sensor 12 and by the on-chip magnetic field sensor 32. Thus, the electric shield 15 may be a metal layer shield and should be configured to avoid eddy currents. For example, the electric shield 15 may be implemented as a grid of fine wires, as a mesh, or as a spiral. Each of these shapes have cuts in the layer to avoid large loops for eddy currents, yet they still work well enough to shield electric fields from the sensors 12 and 32 and the sensor circuit 34.

As noted above, since usually the off-chip coil 12, as a passive component, is not supplied with electric power, its DC potential is undefined. As a result, the sensor circuit 34 may be configured to define the common mode potential of at least one terminal of the at least two input terminals for the coil.

It will be appreciated that other elements of the magnetic field sensor system 10 shown in FIG. 4 are similar to those previously described. Thus, the description thereof is omitted for conciseness.

In view of the foregoing, the on-chip magnetic sensor 32 may detect static and low-frequency magnetic fields, while the off-chip magnetic sensor 12 may detect high frequency magnetic fields. Thereafter, the signals of on-chip and off-chip sensor elements are combined to give a response that is flat from DC to several MHz.

In addition, by splitting off the off-chip magnetic sensor 12 (e.g., the off-chip coil 12) from the sensor package 14, larger sensitivities (e.g., by many turns of the winding or by larger area of the turns) can be achieved for the off-chip magnetic sensor 12 so that the cross-over frequency between on-chip and off-chip sensor elements in the signal conditioning and combining circuit can be chosen at very low frequencies.

FIG. 5 show a flow diagram of a method 500 of measuring magnetic fields using a first magnetic sensor disposed within a sensor package and a second magnetic sensor disposed external to the sensor package, where the first magnetic sensor and the second magnetic sensor share a cross-over frequency. While the flow diagram depicts a series of sequential operations, unless explicitly stated, no inference should be drawn from that sequence regarding specific order of performance, performance of operations or portions thereof serially rather than concurrently or in an overlapping manner, or performance of the operations depicted exclusively without the occurrence of intervening or intermediate operations. The process depicted in the example is implemented by, for example, one or more magnetic field sensor systems described above.

According to FIG. 5, the method 500 includes measuring, by the first magnetic sensor, a first magnetic field in a first frequency range (operation 501), measuring, the second magnetic sensor, a second magnetic field in a second frequency range higher than the first frequency range (operation 502), outputting, by the first magnetic sensor, a first sensor signal based on the measured first magnetic field (operation 503), outputting, by the second magnetic sensor, a second sensor signal based on the measured second magnetic field (operation 504), receiving, by a sensor circuit disposed within the sensor package, the first sensor signal and the second sensor signal (operations 505a and 505b), combining, by the sensor circuit, the first sensor signal and the second sensor signal (operation 506), and outputting, by the sensor circuit, a combined sensor signal derived from combining the first sensor signal and the second sensor signal (operation 507).

A single magnetic field source may generate the first magnetic field and the second magnetic field.

The cross-over frequency may be a frequency greater than 0 Hz and less than 20 kHz. Furthermore, the first frequency range may include a frequency of 0 Hz, and the second frequency range may include a frequency of at least 1 MHz While various embodiments have been described, it will be apparent to those of ordinary skill in the art that many more embodiments and implementations are possible within the scope of the invention. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A magnetic field sensor system comprising:
   a magnetic field source configured to generate a first magnetic field, a second magnetic field, and an electric field;
   a first magnetic sensor configured to measure the first magnetic field in a first frequency range and output a first sensor signal based on the measured first magnetic field;

a second magnetic sensor configured to measure the second magnetic field in a second frequency range and output a second sensor signal based on the measured second magnetic field;

a sensor circuit comprising a first input terminal and a second input terminal, the sensor circuit being electrically coupled to the first magnetic sensor and the first input terminal and the second input terminal being electrically coupled to the second magnetic sensor, the sensor circuit configured to receive the first sensor signal and the second sensor signal, and output a combined sensor signal derived from the first sensor signal and the second sensor signal;

a substrate comprising a first main surface and a second main surface arranged opposite to the first main surface; and an electric shield disposed in the substrate, between the second magnetic sensor and the magnetic field source, the electric shield configured to shield at least the second magnetic sensor from the electric field generated by the magnetic field source, wherein the second magnetic sensor is a differential inductance coil having a first winding and a second winding coupled together in a subtracting configuration, the first winding being configured to generate a first component of the second sensor signal and provide the first component to the first input terminal of the sensor circuit, the second winding being configured to generate a second component of the second sensor signal and provide the second component to the second input terminal of the sensor circuit.

2. The magnetic field sensor system of claim 1, wherein the electric shield is disposed in the substrate, between the first magnetic sensor and the magnetic field source, the electric shield configured to shield the first magnetic sensor and the second magnetic sensor from the electric field generated by the magnetic field source.

3. The magnetic field sensor system of claim 1, wherein the first magnetic sensor and the second magnetic sensor are coupled to the second main surface of the substrate.

4. The magnetic field sensor system of claim 1, wherein the magnetic field source is a conductor, and the first magnetic field and the second magnetic field are generated by a current passing through the conductor.

5. The magnetic field sensor system of claim 1, wherein the first magnetic sensor and the sensor circuit are integrated on a semiconductor die disposed on the second main surface.

6. The magnetic field sensor system of claim 1, further comprising:
a first semiconductor die disposed on the second main surface and having the first magnetic sensor integrated thereon; and
a second semiconductor die disposed on the second main surface and having the sensor circuit integrated thereon.

7. The magnetic field sensor system of claim 1, wherein the first winding and the second winding are symmetrically arranged about a center longitudinal axis of the magnetic field source.

8. The magnetic field sensor system of claim 1, wherein the sensor circuit is configured to receive the first component and the second component of the second sensor signal, and derive the second sensor signal from the first component and the second component of the second sensor signal.

9. The magnetic field sensor system of claim 8, wherein the first magnetic sensor includes a first set of sensor elements and a second set of set of sensor elements, the first set of sensor elements is configured to generate a first component of the first sensor signal, and the second set of sensor elements is configured to generate a second component of the first sensor signal.

10. The magnetic field sensor system of claim 9, wherein the first set of sensor elements and the second set of sensor elements are electrically connected to the sensor circuit in a subtracting configuration.

11. The magnetic field sensor system of claim 9, wherein the first set of sensor elements and the second set of sensor elements are symmetrically arranged about and spaced away from a center longitudinal axis of the magnetic field source.

12. The magnetic field sensor system of claim 9, wherein each sensor element of the first and the second set of sensor elements is a spinning current Hall plate configured to operate in a spinning current mode.

13. The magnetic field sensor system of claim 1, wherein the first magnetic sensor is a Hall sensor.

14. The magnetic field sensor system of claim 1, wherein the sensor circuit is configured to combine the first sensor signal and the second sensor signal, and output the combined sensor signal derived from combining the first sensor signal and the second sensor signal.

15. The magnetic field sensor system of claim 1, further comprising:
a via disposed in the substrate, the via being electrically coupled to the electric shield and to a sensor ground of the sensor circuit.

16. The magnetic field sensor system of claim 1, wherein the second magnetic sensor is the differential inductance coil having the first winding, the second winding, and a common coil segment at which the first winding and the second winding are coupled together in the subtracting configuration to form a one-piece unitary member.

17. A method of measuring magnetic fields using a first magnetic sensor and a second magnetic sensor, the second magnetic sensor being a differential inductance coil having a first winding and a second winding coupled together in a subtracting configuration, the method comprising:
generating, by a magnetic field source, a first magnetic field, a second magnetic field, and an electric field, wherein the magnetic field source is coupled to a first main surface of a substrate;
measuring, by the first magnetic sensor, the first magnetic field in a first frequency range;
outputting, by the first magnetic sensor, a first sensor signal to a sensor circuit based on the measured first magnetic field;
measuring, by the second magnetic sensor, the second magnetic field in a second frequency range;
generating, by the second magnetic sensor, a second sensor signal based on measuring the second magnetic field, wherein a first component of the second sensor signal is generated by the first winding and a second component of the second sensor signal is generated by the second winding;
shielding, by an electric shield disposed in the substrate between the first main surface and the second main surface, at least the second magnetic sensor from the electric field generated by the magnetic field source;
outputting, by the first winding, the first component of the second sensor signal to the sensor circuit;
outputting, by the second winding, the second component of the second sensor signal to the sensor circuit; and
generating, by the sensor circuit, a combined sensor signal derived from the first sensor signal, the first component of the second sensor signal, and the second component of the second sensor signal.

18. The method of claim 17, further comprising:
combining, by the sensor circuit, the first sensor signal, the first component of the second sensor signal, and the second component of the second sensor signal; and
outputting, by the sensor circuit, the combined sensor signal.

19. The method of claim 17, wherein shielding the at least the second magnetic sensor from the electric field generated by the magnetic field source further comprises:
shielding, by the electric shield disposed in the substrate between the first main surface and the second main surface, the first magnetic sensor and the second magnetic sensor from the electric field generated by the magnetic field source.

* * * * *